US009980399B2

(12) United States Patent
Cho et al.

(10) Patent No.: US 9,980,399 B2
(45) Date of Patent: May 22, 2018

(54) DISPLAY DEVICE

(71) Applicant: LG DISPLAY CO., LTD., Seoul (KR)

(72) Inventors: SeokHyo Cho, Goyang-si (KR); Yongjoon Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/380,658

(22) Filed: Dec. 15, 2016

(65) Prior Publication Data

US 2017/0188470 A1   Jun. 29, 2017

(30) Foreign Application Priority Data

Dec. 28, 2015   (KR) .................. 10-2015-0187067

(51) Int. Cl.
| | |
|---|---|
| *H05K 5/00* | (2006.01) |
| *G09F 9/30* | (2006.01) |
| *H05K 5/02* | (2006.01) |
| *H05K 5/03* | (2006.01) |

(52) U.S. Cl.
CPC ........... *H05K 5/0017* (2013.01); *G09F 9/301* (2013.01); *H05K 5/0217* (2013.01); *H05K 5/03* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,058,758 B2* | 6/2015 | Shin | ...................... | G09G 3/3688 |
| 9,081,540 B1* | 7/2015 | Cho | ...................... | G06F 1/1601 |
| 9,116,662 B1* | 8/2015 | Song | ...................... | G06F 1/1601 |
| 9,123,290 B1* | 9/2015 | Cho | ...................... | G06F 1/1652 |
| 9,304,539 B2* | 4/2016 | Song | ...................... | G06F 1/1601 |
| 9,307,658 B2* | 4/2016 | Song | ...................... | H05K 5/0217 |
| 9,311,843 B2* | 4/2016 | Kim | ...................... | G06F 1/1652 |
| 9,390,642 B2* | 7/2016 | Kim | ...................... | G09G 3/3225 |
| 9,510,469 B2* | 11/2016 | Song | ...................... | H05K 5/0217 |
| 9,536,456 B2* | 1/2017 | Kang | ...................... | G09F 9/301 |
| 9,541,952 B2* | 1/2017 | Kang | ................. | H01L 51/0097 |
| 9,560,775 B2* | 1/2017 | Park | ...................... | H04N 5/64 |
| 9,736,951 B2* | 8/2017 | Cho | ...................... | H05K 5/0017 |
| 9,746,701 B2* | 8/2017 | Sung | ...................... | G09F 9/301 |
| 2011/0249425 A1* | 10/2011 | Aurongzeb | ............. | F21V 14/02 362/102 |
| 2012/0281367 A1* | 11/2012 | He | .......................... | H05K 5/02 361/728 |
| 2013/0155655 A1* | 6/2013 | Lee | .......................... | H05K 5/03 362/97.1 |
| 2014/0140023 A1* | 5/2014 | Lee | .......................... | H05K 5/03 361/755 |

(Continued)

FOREIGN PATENT DOCUMENTS

| | | |
|---|---|---|
| JP | 2-57617 U | 4/1990 |
| JP | 4-16275 U | 2/1992 |

(Continued)

*Primary Examiner* — Lisa Lea Edmonds

(74) *Attorney, Agent, or Firm* — Dentons US LLP

(57) ABSTRACT

A display device is disclosed. A back cover supports a back surface of a display panel. A bending member is bent at a predetermined curvature and attached to the back surface of the back cover. A curvature-changing unit is coupled to the back surface of the back cover to rotate the bending member and change the curvature of either the display panel or the back cover.

10 Claims, 6 Drawing Sheets

(56) References Cited

U.S. PATENT DOCUMENTS

| | | | | |
|---|---|---|---|---|
| 2014/0226266 A1* | 8/2014 | Kang | ............... | H01L 51/0097 |
| | | | | 361/679.01 |
| 2014/0240906 A1* | 8/2014 | Seo | ............... | A47B 81/06 |
| | | | | 361/679.01 |
| 2014/0247566 A1* | 9/2014 | Lee | ............... | H05K 5/03 |
| | | | | 361/749 |
| 2014/0314999 A1* | 10/2014 | Song | ............... | G06F 1/1601 |
| | | | | 428/174 |
| 2014/0354519 A1* | 12/2014 | Lee | ............... | G09F 9/301 |
| | | | | 345/76 |
| 2014/0376163 A1* | 12/2014 | Song | ............... | H04N 5/64 |
| | | | | 361/679.01 |
| 2015/0009635 A1* | 1/2015 | Kang | ............... | G09F 9/301 |
| | | | | 361/749 |
| 2015/0035812 A1* | 2/2015 | Shin | ............... | G09G 3/3688 |
| | | | | 345/204 |
| 2015/0043136 A1* | 2/2015 | Kim | ............... | G02F 1/133305 |
| | | | | 361/679.01 |
| 2015/0092361 A1* | 4/2015 | Cho | ............... | H02K 7/00 |
| | | | | 361/749 |
| 2015/0185761 A1* | 7/2015 | Song | ............... | G06F 1/1601 |
| | | | | 361/679.21 |
| 2015/0195932 A1* | 7/2015 | Lee | ............... | H05K 5/0217 |
| | | | | 361/749 |
| 2015/0296641 A1* | 10/2015 | Song | ............... | H05K 5/0217 |
| | | | | 361/679.01 |
| 2016/0040764 A1* | 2/2016 | Park | ............... | G09F 9/301 |
| | | | | 361/679.01 |
| 2016/0127674 A1* | 5/2016 | Kim | ............... | G09G 5/003 |
| | | | | 348/739 |
| 2016/0192519 A1* | 6/2016 | Song | ............... | H05K 5/0217 |
| | | | | 361/679.01 |
| 2016/0218316 A1* | 7/2016 | Lee | ............... | H05K 5/03 |
| 2016/0224059 A1* | 8/2016 | Song | ............... | G06F 1/1601 |
| 2016/0252236 A1* | 9/2016 | Chen | ............... | G02F 1/133 |
| | | | | 362/97.1 |
| 2016/0295711 A1* | 10/2016 | Ryu | ............... | G09F 9/301 |
| 2016/0353594 A1* | 12/2016 | Cho | ............... | F16M 11/02 |
| 2017/0013728 A1* | 1/2017 | Lee | ............... | F21V 7/0066 |
| 2017/0112000 A1* | 4/2017 | Park | ............... | H04N 5/64 |
| 2017/0124937 A1* | 5/2017 | Kim | ............... | G09G 3/2096 |
| 2017/0193863 A1* | 7/2017 | Cho | ............... | H05K 5/0217 |
| 2017/0238429 A1* | 8/2017 | Zeng | ............... | H05K 5/0017 |
| | | | | 361/807 |

FOREIGN PATENT DOCUMENTS

| | | |
|---|---|---|
| JP | 10-26754 A | 1/1998 |
| JP | 2000-267191 A | 9/2000 |
| JP | 2015-161766 A | 9/2015 |
| JP | 2015-210521 A | 11/2015 |

\* cited by examiner

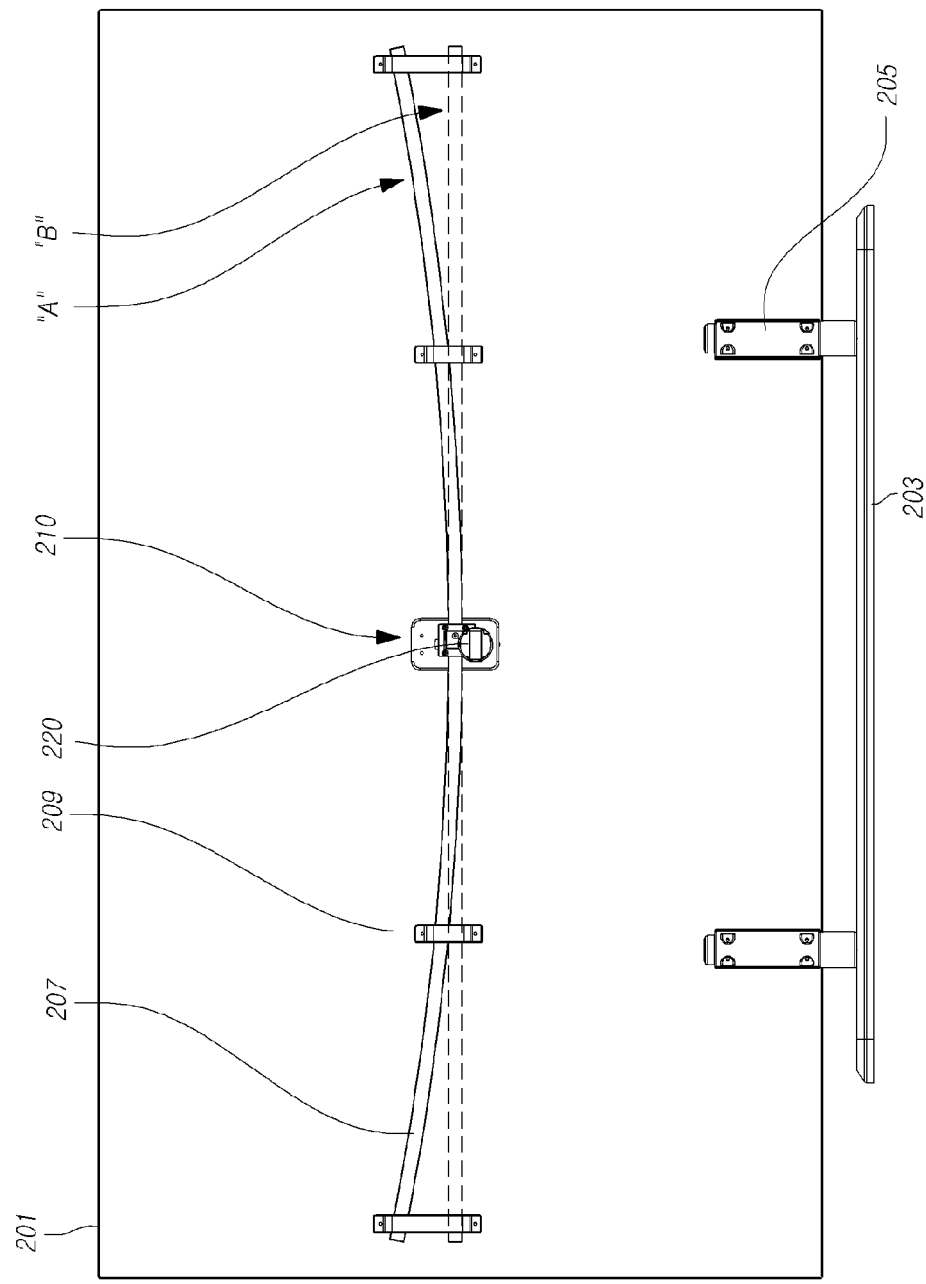

DISPLAY DEVICE

CROSS REFERENCE TO RELATED APPLICATION

This application claims priority from Korean Patent Application No. 10-2015-0187067 filed on Dec. 28, 2015, which is hereby incorporated by reference for all purposes as if fully set forth herein.

BACKGROUND

Field

The present disclosure relates to a display device. More particularly, the present disclosure relates to a display device having a display panel, the curvature of which is changeable according to a user selection.

Description of Related Art

Generally, research into flat panel display devices, such as liquid crystal display devices, plasma display devices, and organic light-emitting display devices, has been actively undertaken. In this regard, liquid crystal display devices and organic light-emitting display devices have become prominent in terms of production technology, ease of driving, and high definition realization.

In particular, there has recently been a need for research into and development of flat panel display devices with various product designs appealing to consumers. Therefore, the demand for display devices having a degree of curvature, such as curved surface display devices or curved display devices, has been gradually increased.

To date, curved surface display devices have been developed by forming a panel and a back cover to have a predetermined curvature and coupling a fixing device having the same curvature as the back cover to the rear surface of the back cover.

FIG. 1 is an exploded perspective view illustrating a conventional display device.

As illustrated in FIG. 1, the display device of the related art includes a display panel 110, an external case 120 accommodating the display panel 110, and a support stand 130 connected to a lower end or a rear surface of the external case 120 and fixed to a desk or a wall.

The display device of the related art operates in a flat mode and a curved mode by a curvature change device 140 disposed on a rear surface of the display panel 110. That is, a plurality of joint plates 150 connected to a plurality of motors 160 are bent at a desired angle by operating the plurality of motors 160 to change a curvature of the display panel 110.

However, such a curved surface display device or a curved display device has a structure in which respective joint plates are coupled to a rear surface of the display panel, thereby increasing the number of components, the number of operation processes and manufacturing costs.

Also, since the curvature is changed by operating the motor, operation noise may be loud and power consumption may increase. Furthermore, when the motor is broken, the external case typically needs to be separated to repair the motor.

BRIEF SUMMARY

Various aspects of the present disclosure provide a display device that allows the user to perform a curvature change of a display between a flat mode and a curved mode.

Various aspects of the present disclosure provide a display device that allows the user to easily change a curvature of a display, even for a large-sized display, to be able to meet various user demands.

Advantages and objects of the present disclosure are not limited to the aforementioned configurations, and other advantages and objects not described herein will be clearly understood by a person skilled in the art from descriptions provided hereinafter.

In an aspect of the present disclosure, a display device may include: a back cover that supports a back surface of a display panel; a bending member bent at a predetermined curvature and attached to the back surface of the back cover; and a curvature-changing unit coupled to the back surface of the back cover that rotates the bending member and changes a curvature of either the display panel or the back cover.

A curvature of a display device according to an embodiment of present disclosure can be selectively changed between a flat display state and a curved display state by a user. Also, a curvature can be easily changed by a user irrespective of the size of a display device, thereby providing convenience to the user.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present disclosure will be more clearly understood from the following detailed description when taken in conjunction with the accompanying drawings, in which:

FIG. 6 is a rear view illustrating an operating state of a display device according to an exemplary embodiment.

DETAILED DESCRIPTION OF THE ILLUSTRATED EMBODIMENTS

Figure 1:
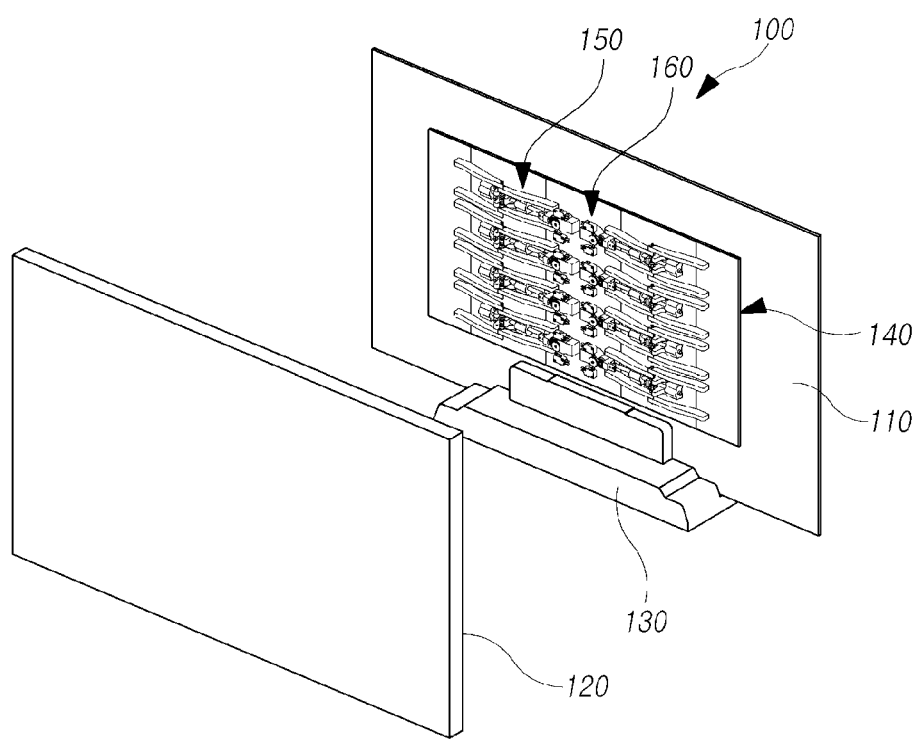
FIG. 1 is an exploded perspective view illustrating a conventional display device.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Figure 2:
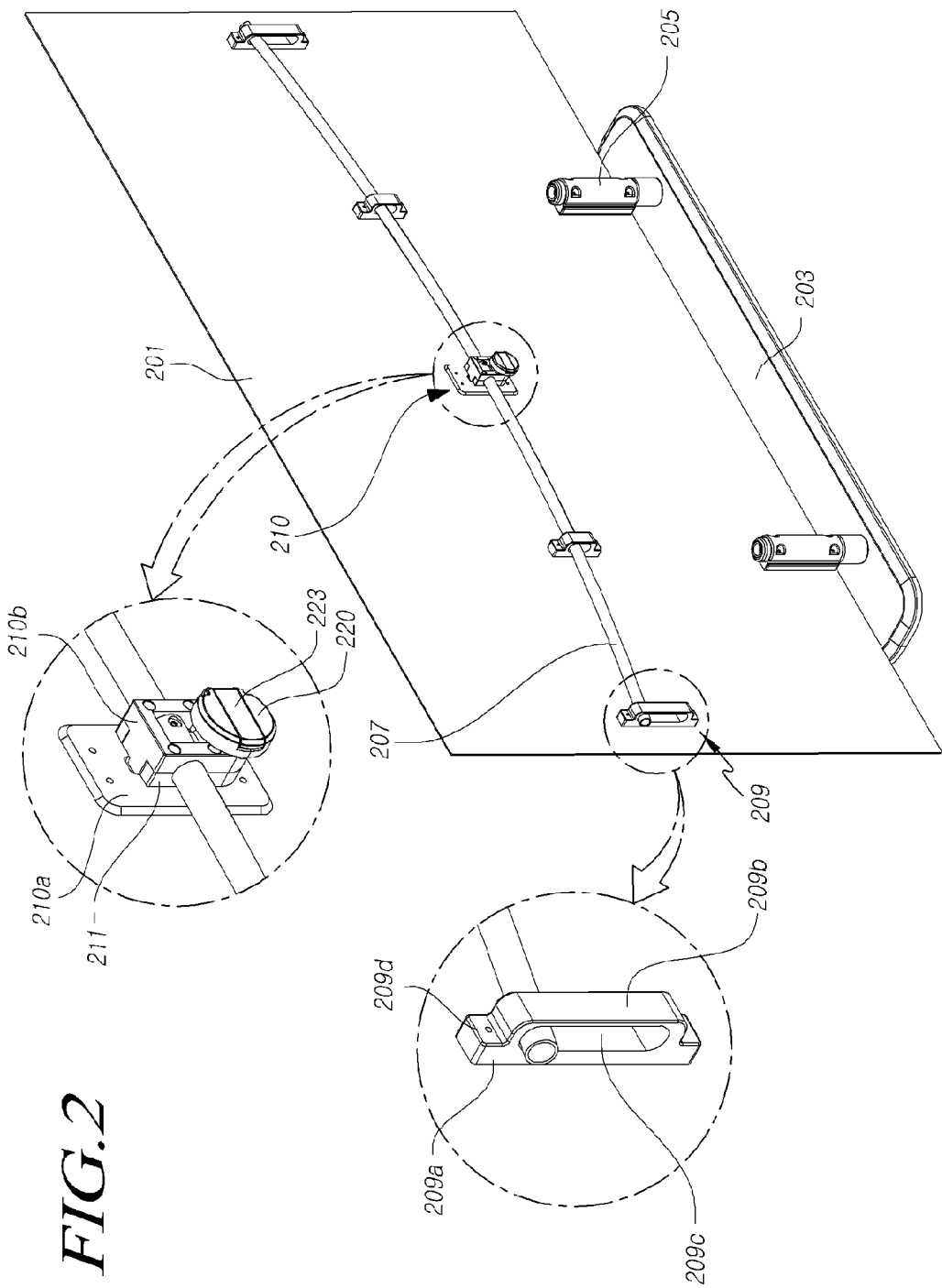
FIG. 2 is a perspective view illustrating a display device according to an exemplary embodiment.
Figure 3:
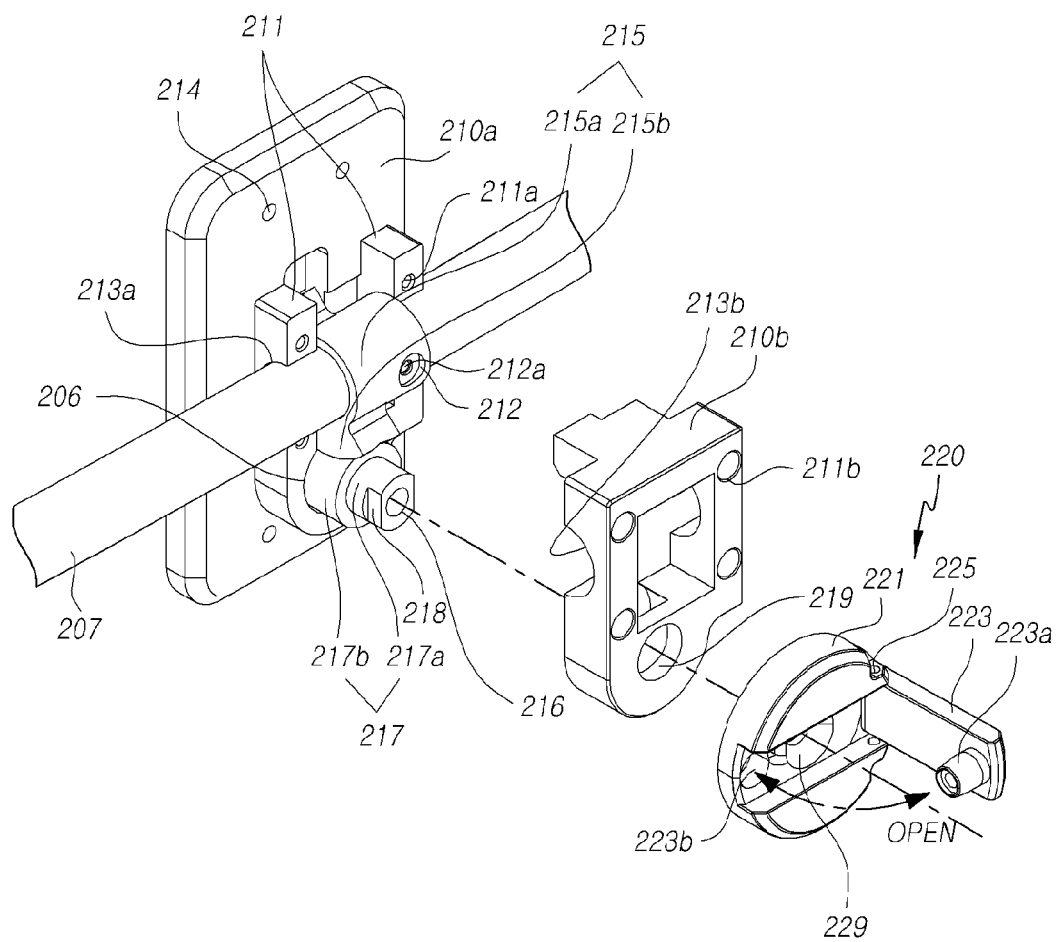
FIG. 3 is an exploded perspective view of a part of FIG. 2.
Figure 4:
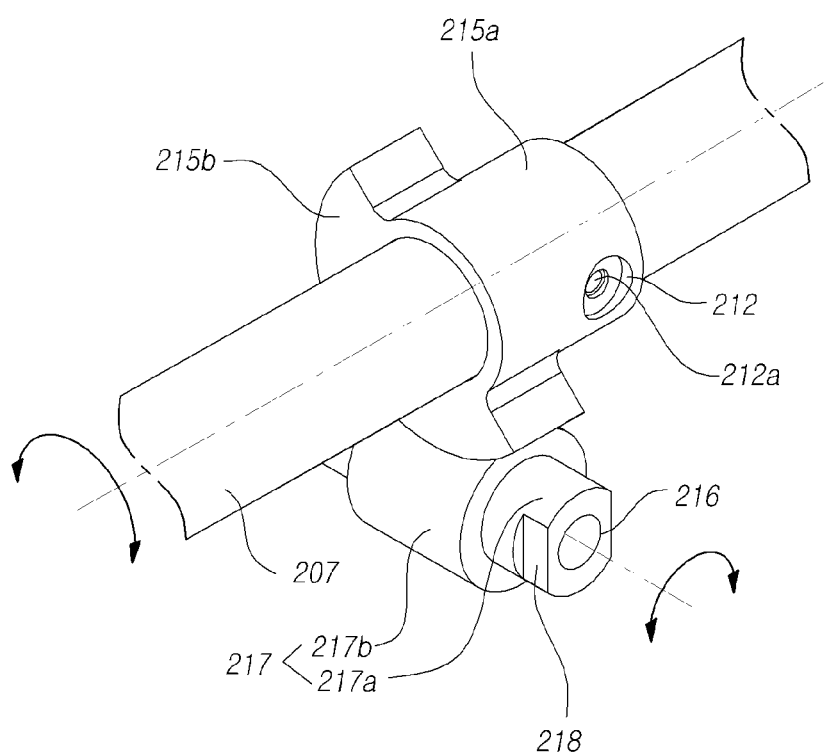
FIG. 4 is a perspective view of a part of FIG. 3.
Figure 5:
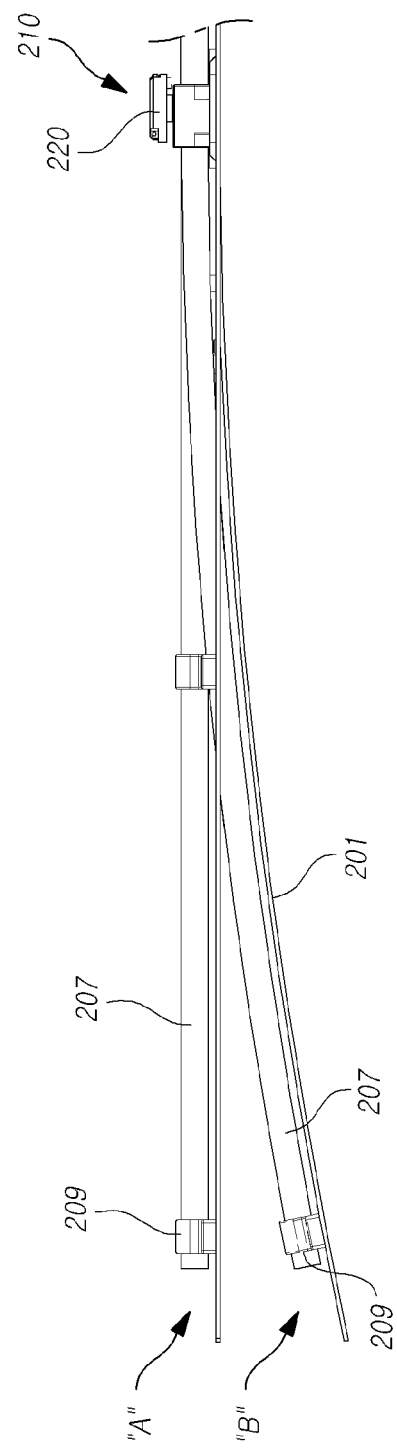
FIG. 5 is a plan view illustrating an operating state of a display device according to an exemplary embodiment.

FIG. 2 is a perspective view illustrating a display device according to an exemplary embodiment, FIG. 3 is an exploded perspective view of a part of FIG. 2, FIG. 4 is a perspective view of a part of FIG. 3, FIG. 5 is a plan view illustrating an operating state of a display device according to an exemplary embodiment, and FIG. 6 is a rear view illustrating an operating state of a display device according to an exemplary embodiment.

Referring to FIGS. 2 to 6, the display device includes a back cover 201 supporting the back surface of a display panel, a bending member 207 bent at a certain degree of curvature and supported by and attached to a back surface of the back cover 201, and a curvature-changing unit 210 coupled to a back surface of the back cover for rotating the bending member 207 to change a curvature of the display panel and the back cover 201.

Connection members 205 are connected between a lower portion of the back cover 201 and a support 203 in order to support the display device on a desk or a table. The display panel may adopt a liquid-crystal display panel, a light-emitting display panel, or the like.

When the display panel is a liquid-crystal display panel, the display device may further include a backlight unit emitting light towards the liquid-crystal display panel, a lower polarizing plate attached to a lower substrate, and an upper polarizing plate attached to an upper substrate. The upper and lower substrates may be provided in various forms known in the art according to a driving mode of the liquid-crystal panel, such as twisted nematic (TN) mode, vertical alignment (VA) mode, in-plane switching (IPS) mode, and fringe field switching (FF) mode.

In addition, when the display panel is a light-emitting display panel, the light-emitting display panel may include a lower substrate having a plurality of light-emitting cells formed in respective regions defined by gate lines, data lines, and power (VDD) lines, and an upper substrate surface-attached to the lower substrate. Since various configurations are known in the art, drawings and detailed descriptions thereof are omitted.

As described above, the display device according to an embodiment of the present disclosure can use various types of display panels. In the following description, the type of the display panel is not specified.

As illustrated in FIG. 2, when the curvature-changing unit 210 attached to the back of the display device, i.e. the back surface of the back cover 201, rotates the bending member 207 supported by and attached to the back surface of the back cover 201, the display device changes its display mode between a flat display mode A and a curved display mode B.

The bending member 207 is formed of a high-strength metallic material, such as aluminum alloy or stainless steel, that is beneficial for bending the display panel and the back cover 201.

The bending member 207 has a curvature at which the user can easily view the screen of the display device. The bending member 207 beneficially has a curvature of about 6000 mm to about 2000 mm when the display device is in the curved display mode B.

In the curved display mode B, the bending member 207 is rotated by the curvature-changing unit 210 such that a center point of the curvature is positioned towards a forward direction perpendicular to the back cover 201. In the flat display mode A, the bending member 207 is rotated such that the center point of the curvature is positioned towards an upper direction parallel with the back cover 201. That is, in the curved display mode B, the bending member 207 is rotated such that a plane defined by the bending member 207 and the center point of the curvature becomes perpendicular to the back cover 201, and in the flat display mode A, the bending member 207 is rotated such that a plane defined by the bending member and the center point of the curvature becomes parallel with the back cover 201, allowing the back cover 201 to be elastically deformed to change the mode of the display device into the curved display mode B. For example, FIG. 2 illustrates the display device in the flat display mode A.

Referring to FIG. 3, the curvature-changing unit 210 includes a worm wheel gear 215 coupled to an outer surface of the bending member 207 to rotate the bending member 207, a worm gear 217 meshed with the worm wheel gear 215 to rotate the worm wheel gear 215, and support members 210a and 210b coupled to the back surface of the back cover 201, the worm wheel gear 215 and the worm gear 217 being housed in the support members 210a and 210b. With the configuration of the curvature-changing unit 210, the user can easily change the display mode between the curved display mode B and the flat display mode A.

The worm wheel gear 215 has a ring-shaped hub 215a and a toothed portion 215b. The curvature-changing unit 210 is configured such that the bending member 207 is coupled through the hub 215a and the toothed portion 215b radially protruding from one side of the hub 215a such that the toothed portion 215b is meshed with the worm gear 217. When the worm gear 217 rotates the worm wheel gear 215, this configuration reduces an operating force of the user to facilitate the rotation.

The worm gear 217 further has a shaft 217a and a toothed portion 217b radially protruding from an outer surface of the shaft 217a such that the toothed portion 217b is meshed with the toothed portion 215b of the worm wheel gear 215. With this configuration, for example, when the worm gear 217 is rotated in a clockwise direction in the flat display mode A as illustrated in FIG. 4, the worn wheel gear 215 is rotated in a counterclockwise direction to rotate the bending member 207, thereby entering into the curved display mode B, as illustrated in FIGS. 5 and 6.

In order to reduce or prevent the bending member 207 from idling, the worm wheel gear 215 has a through-hole 212 extending through the inner and outer surfaces of the hub 215a, and the bending member 207 has a fixing hole 212a communicating with the through-hole 212 of the hub 215a. A fixing member is coupled to the fixing hole 212a through the through-hole 212. With this configuration, when the worm wheel gear 215 rotates, the bending member 207 is rotated by the same number of revolutions as the worm wheel gear 215 without idling, thereby improving user convenience.

The support members include a lower support member 210a, protruding support members 211, and an upper support member 210b. The lower support member 210a is coupled to the back cover 201. The protruding support members 211 protrude from the lower support member 210a. The protruding support members 211 define first seating recesses 213a in which one portion of an outer surface of the bending member 207 is seated and a first coupling hole 206 into which the worm gear 206 is fitted to be supported. The upper support member 210b is supported on the protruding support members 211. The upper support member 210b has a second coupling hole 219 communicating with the first coupling hole 206, the shaft 217a of the worm gear 217 being fitted into the second coupling hole 219, and second seating recesses 213b corresponding to the first seating recesses 213a, an opposite portion of the outer surface of the bending member 207 being seated in the second seating recesses 213b.

With this configuration of the support members, when the user changes the display mode between the curved display mode B and the flat display mode A, the bending member 207, the worm gear 217, the worm wheel gear 215, and the like can be smoothly operated while being firmly supported.

The lower support member 210a is formed of a plate body having fastening holes 214 through which lower support member 210a is coupled to the back cover 201 using fastening members. On a central portion of the lower support member 210a, the protruding support members 211 for supporting the bending member 207 and the worm wheel gear 215 are provided, thereby firmly supporting the bending member 207 and the worm wheel gear 215 while reducing or preventing the back cover 201 from being deformed by operation loads.

The protruding support members 211 are formed to protrude from the lower support member 210a. The first seating recesses 213a of the protruding support members 211 include a pair of first seating recesses 213a spaced apart from each other in a horizontal direction of the back cover 201, thereby supporting the bending member 207 while reducing or preventing the bending member 207 from being dislodged during the rotation of the bending member 207.

The first coupling hole 206 is provided below a center of the first seating recesses 213a to allow the worm gear 217 to be rotatably fitted thereinto, thereby reducing or preventing the worn gear 217 from being dislodged.

The upper support member 210b is coupled to an outer portion of the lower support member 210a such that the worm wheel gear 215 and the worm gear 217 are accommodated and supported therein. The lower and upper support members 210a and 210b are coupled to each other by fastening members fastened to fastening holes 211a of the protruding support members 211 and fastening holes 211b of the upper support member 210b.

The upper support member 210b has the second coupling hole 219 communicating with the first coupling hole 206, such that the shaft of the worm gear 217 is coupled to the second coupling hole 219. The second seating recesses 213b are formed in portions of the upper support member 210b facing the first seating recesses 213a, such that one side of the outer surface of the bending member 207 is seated and supported on the second seating recesses 213b.

With this configuration, the lower support member 210a and the upper support member 210b are coupled to each other while surrounding the worm wheel gear 215 and the worm gear 217. When an operating force from the worm gear 217 is transferred from the worm gear 217 to the bending member 207 through the worm wheel gear 215 in response to a change of the display mode between the flat display mode A and the curved display mode B, the bending member 207, the worm gear 217, and the worm wheel gear 215 can operate while being firmly supported without being dislodged.

A rotary lever 220 is attached to the upper support member 210b to rotate the worm gear 217. The rotary lever 220 has a third coupling hole 229 communicating with the second coupling hole 219, the shaft of the worm gear 217 being fitted into third coupling hole 229. When the rotary lever rotates, the worm gear 217 is rotated to rotate the worm wheel gear 215, thereby improving operation convenience.

Further, facets 218 are formed on opposite circumferential portions of the shaft 217a of the worm gear 217, and planar portions are formed in rear portions of the third coupling hole 229, the planar portions conforming to the facets 218. This configuration serves to reduce or prevent the rotary lever 220 and the shaft 217a of the worm gear 217 from idling during the rotation of the rotary lever 220.

The rotary lever 220 is provided with a grip member 223 to reduce an amount of lever operating force of the user and improve operation convenience. One end of the grip member 223 is pivotably coupled to one side of a lever body 221 by a hinge shaft 225, while the other end of the grip member 223 is detachably coupled to an opposite side of the lever body 221.

Specifically, the grip member 223 is formed of an elongated block. One end of the grip member 223 is hinge-coupled to the lever body 221, while the other end of the grip member 223 is provided with a coupling protrusion 223a that can be detachably coupled to a coupling recess 223b of the lever body 221.

Thus, the coupling protrusion 223a of the grip member 223 remains coupled to the coupling recess 223b of the lever body 221 during normal operation. When the user attempts to change the curvature, the user rotates the grip member 223 outwards to be opened by 180°. In this position, the user can rotate the rotary lever 220 by holding the grip member 223. Consequently, an amount of force for rotating the worm gear 217 can be reduced, thereby improving operation convenience.

The display device further includes a pair of guide members 209 horizontally attached to left and right sides of the back surface of the back cover 201 to support and guide the bending member 207 when the bending member 207 rotates.

Each of the guide members 209 is provided with a coupling portion 209a having coupling holes 209d to be attached to the back cover 201. In addition, a guide portion 209b extends upward from the coupling portion 209a and has a guide hole 209c in which the bending member 207 is received to be supported, thereby guiding the bending member 207 when the bending member 207 rotates.

The guide hole 209c of the guide member 209 is formed as a slit extending in a vertical direction. When the bending member 207 rotates, the guide hole 209c guides the bending member 207 to move in a vertical direction of the back cover 201.

With the above-described configuration, in the curved display mode B, the bending member 207 is shaped such that the plane defined by the bending member 207 and a center point of curvature is perpendicular to the back cover 201. On the other hand, in the flat display mode A, the bending member 207 is shaped such that the plane defined by the bending member 207 and the center point of curvature is parallel to the back cover 201. Thus, a middle portion of the bending member 207, i.e. at a portion of the bending member 207 to which the worm wheel gear 215 is coupled, does not move vertically. In contrast, the vertical movement of the bending member 207 with respect to the back cover 201 gradually increases in a direction toward the opposite ends thereof.

Here, the vertical movement of the bending member 207 is supported and guided by the guide members 209 attached to the back cover 201. The guide members 209 are spaced apart from each other by predetermined distances, in a direction from the center to the opposite ends of the bending member 207.

Specifically, two or more guide members 209 may be attached to the back cover 201 at predetermined distances in a direction from the center to the opposite ends of the bending member 207. The width of the guide hole 209c of the guide member 209 is the same as the thickness of the radially-outermost portion of the bending member 207, such that the curvature of the back cover 201 can be the same as that of the bending member 2007 when the bending member 207 is rotated to change the display mode from the flat display mode A to the curved display mode B.

That is, when there is a gap between the guide hole 209c and the bending member 207 received therein, a degree of curvature change of the back cover 201 due to the rotation of the bending member 207 is reduced as the gap increases. Thus, the thickness of the outermost portion of the bending member 207 is substantially the same as the width of the guide hole 209c. As a result, the curvature of the back cover can be changed according to a degree of rotation of the bending member 207 without reducing a degree of curvature change.

As described above, according to embodiments of the present disclosure, the user can change a curvature of a display device between a flat mode and a curved mode. In particular, the user can easily change a curvature of a display device, even for a large-sized display device, to be able to meet various user demands.

Although the entire components of the exemplary embodiment have been described as being combined together or operating together, it should not be understood that the present disclosure is limited thereto. Rather, one or more of those components may be selectively combined to operate together without departing from the essential characteristics of the present disclosure.

It will be understood that the terms "comprise," "include," "have," and any variations thereof used herein are intended to cover a non-exclusive inclusion unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended Claims and all of their equivalents fall within the scope of the disclosure.

What is claimed is:

1. A display device comprising:
a back cover that supports a back surface of a display panel;
a bending member bent at a predetermined curvature and attached to the back surface of the back cover; and
a curvature-changing unit coupled to the back surface of the back cover that rotates the bending member and changes a curvature of either the display panel or the back cover,
wherein in a curved display mode, the bending member is rotated by the curvature-changing unit such that a center point of the curvature is positioned towards a forward direction perpendicular to the back cover,
and in a flat display mode, the bending member is rotated such that the center point of the curvature is positioned towards an upper direction parallel with the back cover.

2. The display device according to claim 1, wherein the curvature-changing unit comprises:
a worm wheel gear coupled to an outer surface of the bending member to rotate the bending member;
a worm gear meshed with the worm wheel gear to rotate the worm wheel gear; and
support members coupled to the back surface of the back cover, wherein the worm wheel gear and the worm gear are accommodated in the support members.

3. The display device according to claim 2, wherein the worm wheel gear has a ring-shaped hub to which the bending member extending therethrough is coupled and a toothed portion radially protruding from one side of the hub.

4. The display device according to claim 3, wherein the worm wheel gear has a through-hole extending through inner and outer surfaces of the hub, the bending member has a fixing hole communicating with the through-hole, and a fixing member is coupled to the fixing hole through the through-hole.

5. The display device according to claim 2, wherein the support members include:
a lower support member coupled to the back cover;
protruding support members protruding from the lower support member, the protruding support members having a first seating recess in which one portion of an outer surface of the bending member is seated and a first coupling hole into which the worm gear is fitted to be supported thereby; and
an upper support member coupled to the protruding support members, the upper support member having a second coupling hole communicating with the first coupling hole, a shaft of the worm gear being fitted into the second coupling hole, and a second seating recess corresponding to the first seating recess, an opposite portion of the outer surface of the bending member being seated in the second seating recesses.

6. The display device according to claim 5, wherein a rotary lever is attached to the upper support member to rotate the worm gear, wherein the rotary lever has a third coupling hole communicating with the second coupling hole, the shaft of the worm gear being fitted into third coupling hole.

7. The display device according to claim 6, wherein the rotary lever comprises a grip member, one end of the grip member being pivotably coupled to a lever body by means of a hinge shaft, and the other end of the grip member being detachably coupled to the lever body.

8. The display device according to claim 1, further comprising a guide member attached to the back surface of the back cover, the guide member having a guide hole in which the bending member is received and supported.

9. The display device according to claim 8, wherein the guide hole of the guide member is a slit extending in a vertical direction of the back cover.

10. The display device according to claim 9, wherein a width of the guide hole is the same as a thickness of a radially outermost portion of the bending member.

* * * * *